(12) United States Patent
Ta et al.

(10) Patent No.: US 6,977,532 B2
(45) Date of Patent: Dec. 20, 2005

(54) DUAL DIFFERENTIAL COMPARATOR CIRCUIT WITH FULL RANGE OF INPUT SWING

(75) Inventors: Chiu Jui Ta, Keelung (TW); Hsi-Yuan Wang, Hsinchu (JP)

(73) Assignee: Winbond Electronics Corporation, (TW)

( * ) Notice: Subject to any disclaimer, the term of this patent is extended or adjusted under 35 U.S.C. 154(b) by 0 days.

(21) Appl. No.: 10/692,433

(22) Filed: Oct. 23, 2003

(65) Prior Publication Data

US 2004/0085097 A1  May 6, 2004

(30) Foreign Application Priority Data

Nov. 1, 2002  (TW) .................... 91132447 A

(51) Int. Cl.[7] ............................................. H03K 5/22
(52) U.S. Cl. ...................... 327/63; 327/65; 327/70
(58) Field of Search .............................. 327/63, 65, 70, 327/72, 77, 78, 82, 90, 96; 330/51

(56) References Cited

U.S. PATENT DOCUMENTS

| | | | | |
|---|---|---|---|---|
| 4,529,893 A | * | 7/1985 | Nagano | ................. 327/75 |
| 5,396,131 A | * | 3/1995 | Miki et al. | .............. 327/65 |
| 5,804,970 A | * | 9/1998 | Villa et al. | ............. 324/379 |
| 6,172,535 B1 | * | 1/2001 | Hopkins | .................. 327/66 |
| 6,384,679 B1 | * | 5/2002 | Lorenz | ..................... 330/51 |
| 6,445,218 B1 | * | 9/2002 | Lee | ........................ 327/65 |
| 6,486,710 B1 | * | 11/2002 | Simoni | ................... 327/63 |
| 6,714,074 B2 | * | 3/2004 | Lee | ....................... 330/252 |

* cited by examiner

Primary Examiner—Tuan T. Lam
Assistant Examiner—Hiep Nguyen
(74) Attorney, Agent, or Firm—Volpe and Koenig, P.C.

(57) ABSTRACT

The differential comparator circuit for receiving an input voltage within a pre-determined range, amplifying the input voltage, and outputting an output voltage is provided. The circuit includes: a first differential comparator for receiving the input voltage within a first range portion of the range, amplifying the input voltage within the first range portion, and outputting the output voltage, a detecting circuit electrically connected to the first differential comparator, wherein a trigger signal is produced by the detecting circuit when the first differential comparator is shut down and is detected by the detecting circuit, and a second differential comparator electrically connected to the detecting circuit for receiving the input voltage within a second range portion of the range, amplifying the input voltage within the second range portion, and outputting the output voltage in response to the trigger signal.

14 Claims, 4 Drawing Sheets

DUAL DIFFERENTIAL COMPARATOR CIRCUIT WITH FULL RANGE OF INPUT SWING

FIELD OF THE INVENTION

The present invention relates to a dual differential comparator circuit, and more particularly relates to a dual differential comparator circuit with full range of input swing employed in a transmitting terminal of the Universal Serial Bus (USB) as an input differential receiver.

BACKGROUND OF THE INVENTION

The Universal Serial Bus (USB) is a kind of interfaces of the peripheral equipment, and is set up jointly by seven manufacturers of software and hardware. The transmitting speed of this kind of interfaces can be either 1.5 Mbps or 12 Mbps, and can be connected to up to 127 sets of peripheral equipment simultaneously.

Since there is a very restricted regulation regarding the voltage range capable of receiving the input signals $V_{in}$ for the Universal Serial Bus (USB), all voltage values within a certain range (0.8 to 2.2V) should be capable of being received satisfactorily.

Please refer to FIGS. 1(*a*) and 1(*b*), which are the circuits employed for receiving the input signals traditionally. In FIG. 1(*a*), a NMOS is employed for receiving input signals within a voltage range having relatively higher values. In FIG. 1(*b*), a PMOS, with characteristics opposite to the NMOS, is employed for receiving input signals within a voltage range having relatively lower values. The circuits in FIGS. 1(*a*) and 1(*b*) are capable of receiving input voltage $V_{in}$ which is restricted to relatively higher and lower voltage values, and the range of voltage values is also relatively smaller.

But the desired voltage range of the input signals that the Universal Serial Bus (USB) is capable of receiving is getting larger and larger now, the circuits employed traditionally could not meet such a challenge. The manufacturers are all trying their best to combined the PMOS with the NMOS so as to enlarge the voltage range of the input signals that the Universal Serial Bus (USB) is capable of receiving.

Please refer to FIG. 2, it shows a receiving circuit which is a combination of PMOS and NMOS so as to enlarge the voltage range of the input signals. When the input voltage belongs to a relatively lower voltage, the PMOS transistors M5 and M6 receive the input voltage and transmit it to a 1:1 tail-current transistor 20 so as to produce and to output a tail-current. If the input voltage belongs to a relatively higher voltage, the NMOS transistors M1 and M2 receive the input voltage and transmit it to a 1:1 tail-current transistor 21 so as to produce and to output a tail-current.

Though the circuit in FIG. 2 can be employed so as to enlarge the voltage range of input signals, but the tail-current transistors 20 and 21 are always in conducting and their status won't be dynamically changed following the "shut down" "turn on" of the PMOS or NMOS respectively. No matter the transmitting signals are received by which, either a PMOS or a NMOS, there is a tail-current transistor in conducting but not operated so as to increase the power loss.

Besides, the PMOS and the NMOS are conducted simultaneously when the input voltage belongs to the central portion of the voltage range which will result in a relatively higher than normal tail-current so as to cause an extremely high power loss.

Kept the drawbacks of the prior art in mind, and employed experiments and research full-heartily and persistently, a dual differential comparator circuit with full range of input swing is finally conceived by the applicants.

SUMMARY OF THE INVENTION

It is therefore an object of the present invention to provide a dual differential comparator circuit with full range of input swing so as to be employed in a transmitting terminal of the Universal Serial Bus (USB) as an input differential receiver.

According to the aspect of the present invention, the differential comparator circuit for receiving an input voltage within a pre-determined range, amplifying the input voltage into an output voltage, and outputting the output voltage, wherein the range includes a first range portion and a second range portion, and the input voltage ranged in the first range portion is higher than that ranged in the second range portion, includes: a first differential comparator for receiving and amplifying the input voltage within the first range portion, and outputting the output voltage, a detecting circuit electrically connected to the first differential comparator for producing a trigger signal when the detecting circuit detects that the first differential comparator is shut down due to the fact that the input voltage is lower than a lower-limit of the first range portion, and a second differential comparator electrically connected to the detecting circuit for receiving and amplifying the input voltage within the second range portion, and outputting the output voltage in response to the trigger signal.

Preferably, the differential comparator circuit is employed in a transmitting terminal of a Universal Serial Bus (USB).

Preferably, the first differential comparator further includes: a first differential receiving circuit for receiving the input voltage within the first range portion, and a shared active load electrically connected to the first differential receiving circuit for forming a first operational amplifier circuit amplifying the input voltage received by the first differential receiving circuit and generating the output voltage.

Preferably, the second differential comparator further includes: a second differential receiving circuit electrically connected to the detecting circuit for receiving the input voltage ranged in the second range portion in response to the trigger signal and electrically connected to the shared active load for forming a second operational amplifier circuit, amplifying the input voltage received by the second differential receiving circuit and generating the output voltage.

Preferably, the differential comparator circuit further includes an output circuit for outputting the output voltage.

Preferably, the second differential comparator is shut down to avoid a floating when the first differential comparator is operated.

Preferably, the first differential comparator is shut down when the second differential comparator is operated.

According to another aspect of the present invention, the differential comparator circuit for receiving an input voltage within a pre-determined range, amplifying the input voltage into an output voltage, and outputting the output voltage, wherein the range includes a first range portion and a second range portion, and the input voltage ranged in the first range portion is higher than that ranged in the second range portion, includes: a first differential receiving circuit for receiving the input voltage ranged in the first range portion, a detecting circuit electrically connected to the first differential receiving circuit for producing a trigger signal when the detecting circuit detects the first differential receiving circuit is shut down due to the fact that the input voltage is lower than a lower-limit of the first range portion, a second differential receiving circuit electrically connected to the detecting circuit for receiving the input voltage ranged in the second range portion in response to the trigger signal, and a shared active load electrically connected to the first and the second differential receiving circuits for forming a first and second operational amplifier circuits, amplifying the input voltage received by the second differential receiving circuits and generating the output voltage respectively.

Preferably, the differential comparator circuit further includes an output circuit for outputting the output voltage.

Preferably, the second differential receiving circuit is shut down to avoid a floating when the first differential receiving circuit and the shared active load are operated.

Preferably, the first differential receiving circuit is shut down when the second differential receiving circuit and the shared active load are operated.

According to another aspect of the present invention, the differential comparator circuit for receiving an input voltage within a pre-determined range, amplifying the input voltage into an output voltage, and outputting the output voltage, wherein the range includes a first range portion and a second range portion, and the input voltage ranged in the first portion is higher than that ranged in the second range portion, includes: a first differential receiving circuit for receiving the input voltage ranged in the first range portion, a detecting circuit electrically connected to the first differential receiving circuit for producing a trigger signal when the detecting circuit detects that the first differential receiving circuit is shut down due to the fact that the input voltage is lower than a lower-limit of the first range portion, and a second differential receiving circuit electrically connected to the detecting circuit for receiving the input voltage ranged in the second range portion in response to the trigger signal.

The present invention may best be understood through the following descriptions with reference to the accompanying drawings, in which:

DETAILED DESCRIPTION OF THE PREFERRED EMBODIMENT

Figure 1A:
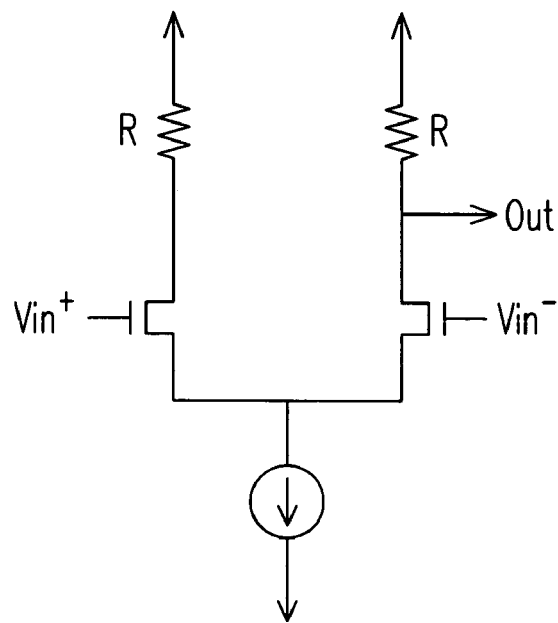
FIGS. 1(a) to 1(b) are the schematic diagrams showing the circuits for receiving input signals of the prior art of the present invention.
Figure 1B:
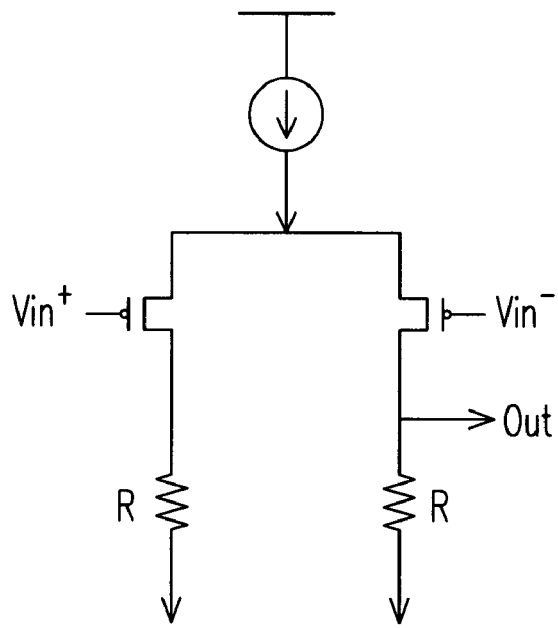
Figure 2:
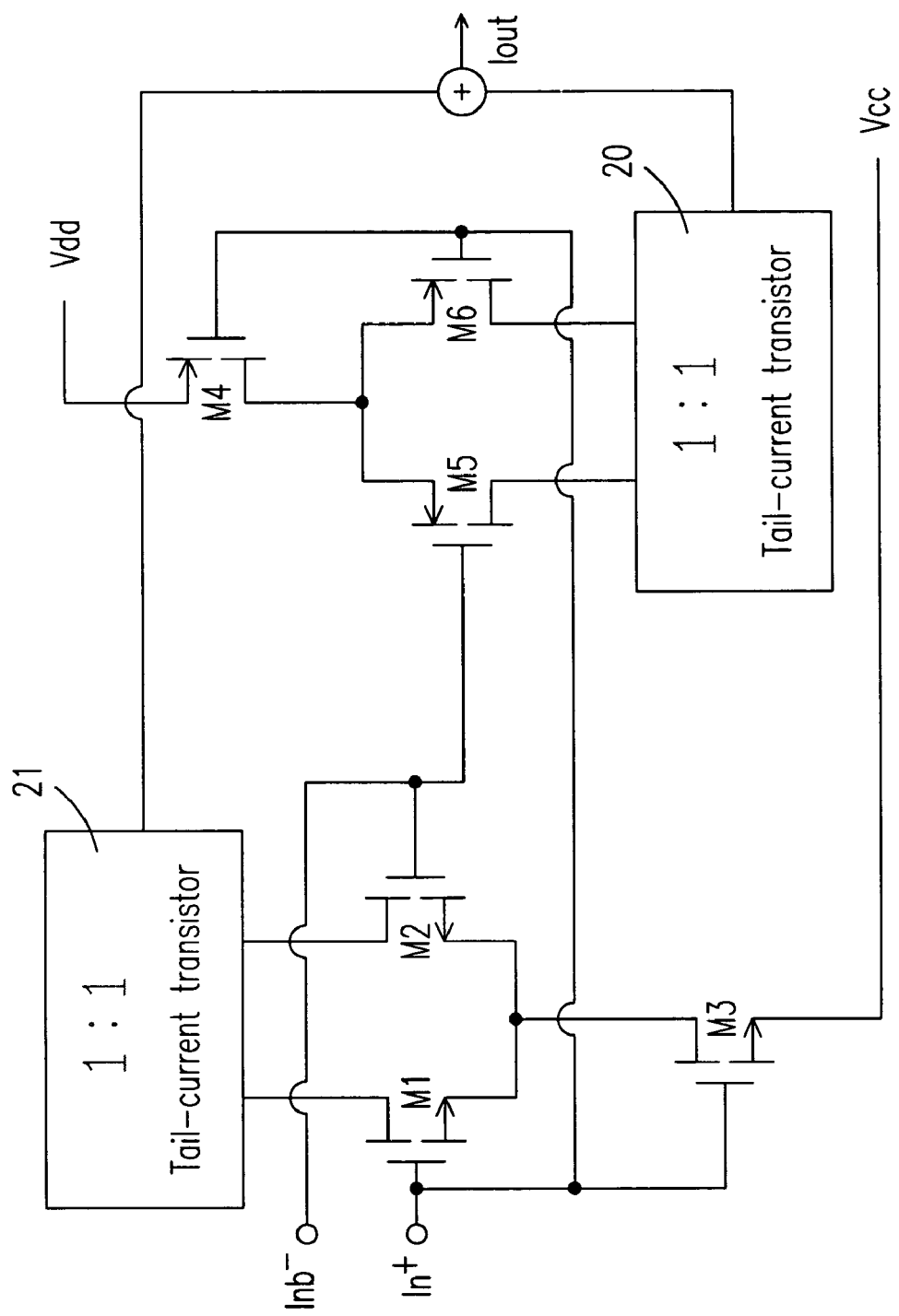
FIG. 2 is a schematic circuit diagram showing the circuit with combined PMOS and NMOS for receiving input signals of the prior art of the present invention.
Figure 3:
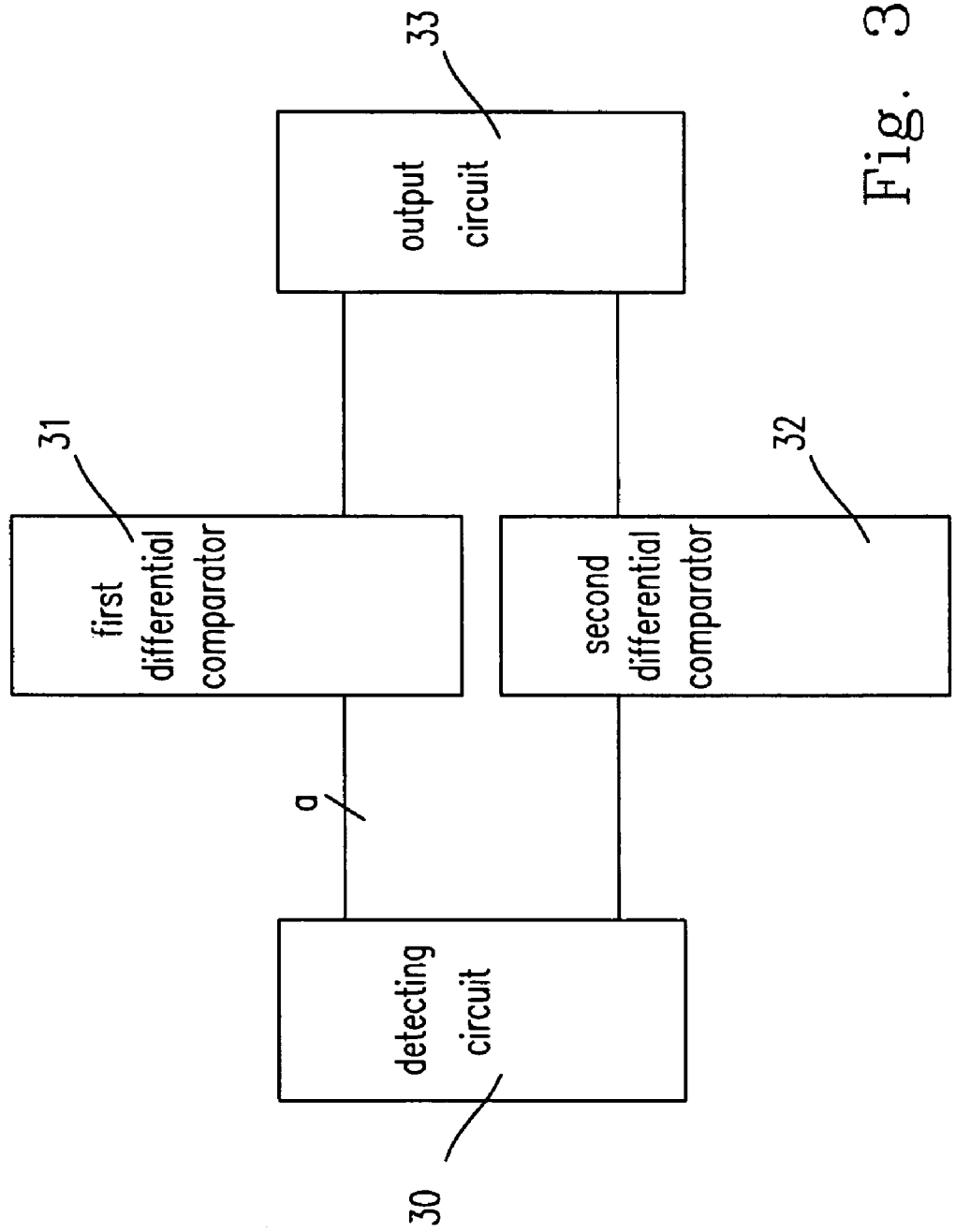
FIG. 3 is a block diagram showing the most preferred embodiment of the present invention.
Figure 4:
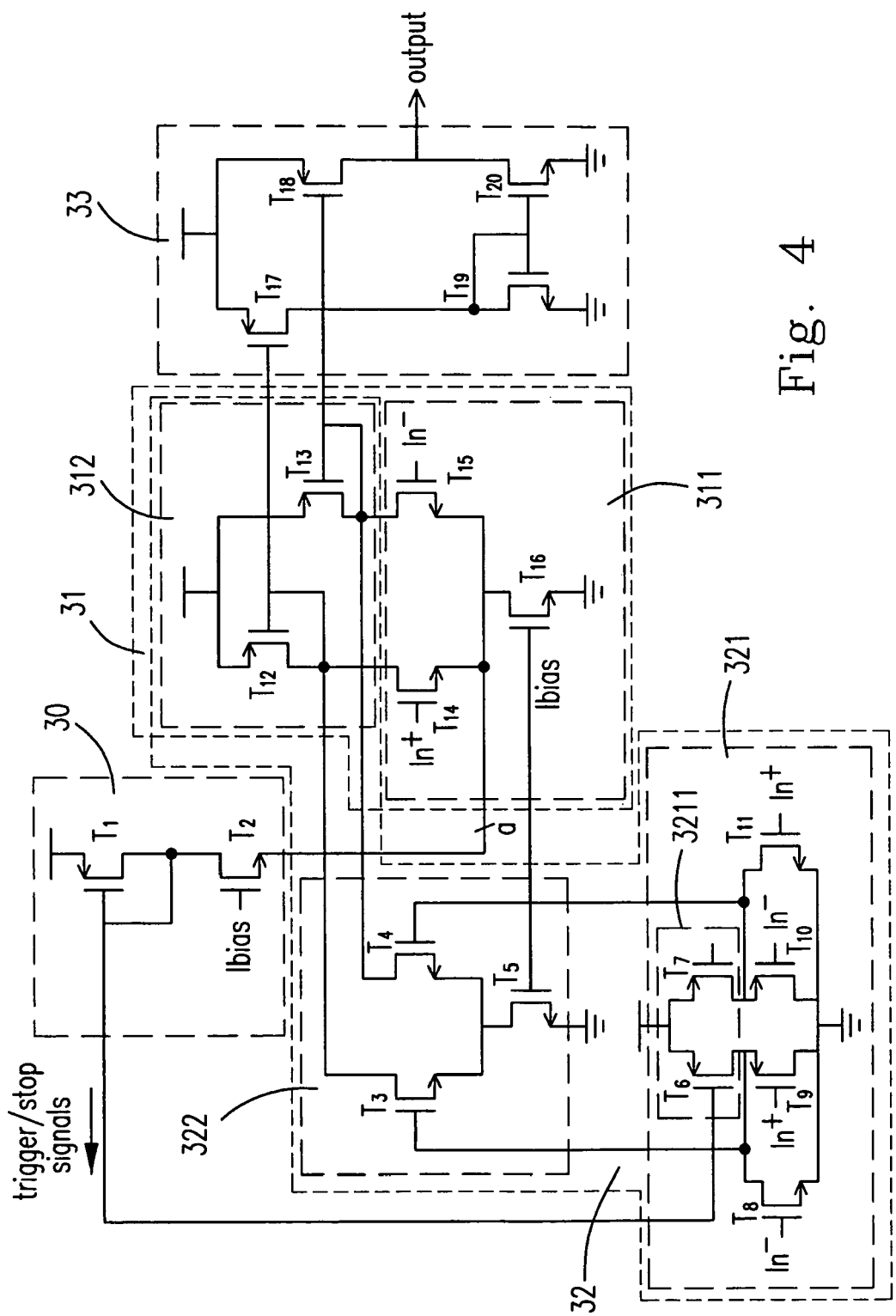
FIG. 4 is a circuit diagram showing the most preferred embodiment of the present invention.

Please refer to FIGS. 3 and 4, which are the block diagram and circuit diagram showing the most preferred embodiment of the present invention respectively.

A dual differential comparator circuit with full range of input swing of the present invention is employed in a transmitting terminal of the Universal Serial Bus (USB) as an input differential receiver for receiving all input signals within the voltage range of 0 to $V_{dd}$ (about 0 to 3.3V), amplifying the input signals, and outputting an output voltage. Therein, the voltage range can be further divided into a first portion with a higher voltage (about 2 to 3.3V), and a second portion with a lower voltage (about 0 to 2V). Please refer to FIG. 3, the above-mentioned circuit of the present invention includes: a detecting circuit 30, a first differential comparator circuit 31, a second differential comparator circuit 32, and an output circuit 33.

Please refer to FIG. 4, the input signals with the input voltages about 2 to 3.3 Volt are received by the first differential comparator circuit 31 through the first differential receiving circuit 311 (having transistors T14–T16), the received input voltages are amplified by the first differential comparator 31 further including a shared active load 312 (having transistors T12–T13) electrically connected to the first differential receiving circuit 311 to form a first operational amplifier (including elements 311, 312), and the output voltages are produced and output through the output circuit 33 (having transistors T17–T20).

The detecting circuit 30 (having transistors T1–T2), electrically connected to the first differential receiving circuit 311, is mainly employed to detect the operational status of the first differential receiving circuit 311 (detecting at the marked place of "a" as shown in FIG. 4). When the first differential receiving circuit 311 is under a receiving status (voltage level of "a" is relatively higher), a stop signal (having a relatively higher voltage level proportional to the voltage level of "a") is produced by the detecting circuit 30 to shut down the second differential comparator circuit 32 to avoid the power loss. When the first differential receiving circuit 311 is shut down due to the voltage of input signal is within the 0 to 2 Volt voltage range and is detected (voltage level of "a" is relatively lower), a trigger signal (having a relatively lower voltage level proportional to the voltage level of "a") is produced by the detecting circuit 30 to drive the second differential comparator 32 for receiving the input signals.

After the second differential comparator 32 is driven by the trigger signal, the input signals each with an input voltage of 0 to 2 Volt are received by the second differential receiving circuit including the pre-amplifier receiving circuit 321 (having transistors T6–T11) and the main receiving circuit 322 (having transistors T3–T5), the received voltages are amplified by the second differential comparator 32 further including the shared active load 312, which is electrically connected to the main receiving circuit 322 to form a second operational amplifier (including elements 322, 312), and the output voltages are produced and output through the output circuit 33.

Therein, the first differential receiving circuit includes a NMOS with two receiving terminals (IN+ and IN−). When the voltage values of IN+>IN−, the output voltage is output at a higher level of $V_{dd}$. When the voltage values of IN+<IN−, the output voltage is output at a lower level of 0. The output voltage mentioned above is varied according to which one of the two values of IN+ and IN− is relatively larger or smaller.

The pre-amplifier receiving circuit 321 includes a set of NMOSs (T8 and T11) and PMOSs (T9–T10) with two receiving terminals (IN+ and IN−) and a level shift circuit 3211 (having transistors T6–T7) so as to avoid the floating and to gain the cumulative effect. Regarding the PMOSs, the output voltage is output at a higher level of $V_{dd}$ when the voltage values of IN+>IN−. Regarding the PMOSs, the output voltage is output at a lower level of 0 when the voltage values of IN+<IN−. The output voltage mentioned above is varied according to which one of the two values of IN+ and IN− is relatively larger or smaller.

Please refer to FIG. 4, the pre-amplifier receiving circuit 321 will be shut down when the receiving voltages of IN+ and IN− are too high. Therein, the level shift circuit 3211 can be employed to amplify the receiving input signals initially and to shut down the two receiving terminals when the stop signal is generated by the detecting circuit 30.

In conclusion, the dual differential comparator circuit of the present invention would effectively guarantee the differential comparator not in use would be shut down totally through the detecting circuit so as to improve the drawbacks of the prior art regarding the power loss with a common mode range of 0 to Vdd, the resolution can reach 50 to 200 mV (currently the desired value of USB 1.1 version is 200 mV), and the maximum delay time is 7 ns. According to the real simulation results mentioned above, the results of the present invention are better than the specification of the USB 1.1 version. Thus, the present invention has its value in the industry, and the purpose of developing the present invention is achieved.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A differential comparator circuit for receiving an input voltage within a pre-determined range, amplifying said input voltage into an output voltage, and outputting said output voltage, wherein said range comprises a first range portion and a second range portion, and said input voltage ranged in said first range portion is higher than that ranged in said second range portion, comprising:
    a first differential comparator for receiving and amplifying said input voltage within said first range portion, and outputting said output voltage, comprising:
    a shared active load for amplifying said input voltage received by said first differential comparator and generating said output voltage;
    a detecting circuit electrically connected to said first differential comparator for producing a trigger signal when said detecting circuit detects that said first differential comparator is shut down due to the fact that said input voltage is lower than a lower-limit of said first range portion; and
    a second differential comparator electrically connected to said detecting circuit and said shared active load for receiving and amplifying said input voltage within said second range portion, and outputting said output voltage in response to said trigger signal respectively.

2. The circuit according to claim 1, wherein said differential comparator circuit is employed in a transmitting terminal of a Universal Serial Bus (USB).

3. The circuit according to claim 1, wherein said first differential comparator further comprises:
    a first differential receiving circuit for receiving said input voltage within said first range portion and electrically connected to said shared active load for forming a first operational amplifier circuit, amplifying said input voltage received by said first differential receiving circuit, and generating said output voltage.

4. The circuit according to claim 1, wherein said second differential comparator further comprises:
    a second differential receiving circuit electrically connected to said detecting circuit for receiving said input voltage ranged in said second range portion in response to said trigger signal and electrically connected to said shared active load for forming a second operational amplifier circuit, amplifying said input voltage received by said second differential receiving circuit, and generating said output voltage.

5. The circuit according to claim 1, further comprising an output circuit for outputting said output voltage.

6. The circuit according to claim 1, wherein said second differential comparator is shut down to avoid a floating when said first differential comparator is operated.

7. The circuit according to claim 1, wherein said first differential comparator is shut down when said second differential comparator is operated.

8. A differential comparator circuit for receiving an input voltage within a pre-determined range, amplifying said input voltage into an output voltage, and outputting said output voltage, wherein said range comprises a first range portion and a second range portion, and said input voltage ranged in said first range portion is higher than that ranged in said second range portion, comprising:
    a first differential receiving circuit for receiving said input voltage ranged in said first range portion;
    a detecting circuit electrically connected to said first differential receiving circuit for producing a trigger signal when said detecting circuit detects said first differential receiving circuit is shut down due to the fact that said input voltage is lower than a lower-limit of said first range portion;
    a second differential receiving circuit electrically connected to said detecting circuit for receiving said input voltage ranged in said second range portion in response to said trigger signal; and
    a shared active load electrically connected to said first and said second differential receiving circuits for forming a first and a second operational amplifier circuits, amplifying said input voltage received by said first and said second differential receiving circuits, and generating said output voltage respectively.

9. The circuit according to claim 8, further comprising an output circuit for outputting said output voltage.

10. The circuit according to claim 8, wherein said second differential receiving circuit is shut down to avoid a floating when said first differential receiving circuit and said shared active load are operated.

11. The circuit according to claim 8, wherein said first differential receiving circuit is shut down when said second differential receiving circuit and said shared active load are operated.

12. A differential comparator circuit for receiving an input voltage within a pre-determined range, amplifying said input voltage into an output voltage, and outputting said output voltage, wherein said range comprises a first range portion and a second range portion, and said input voltage ranged in said first range portion is higher than that ranged in said second range portion, comprising:
    a first differential receiving circuit for receiving said input voltage ranged in said first range portion;
    a detecting circuit electrically connected to said first differential receiving circuit for producing a trigger signal when said detecting circuit detects that said first differential receiving circuit is shut down due to the fact that said input voltage is lower than a lower-limit of said first range portion; and a second differential receiving circuit electrically connected to said detecting circuit for receiving said input voltage ranged in said second range portion in response to said trigger signal, and comprising a pre-amplifier receiving circuit to be shut down when said first differential receiving circuit is operated.

13. The circuit according to claim 12, wherein said second differential receiving circuit further comprises a main receiving circuit.

14. The circuit according to claim 13 further comprising:
a shared active load electrically connected to said first differential receiving circuit and said main receiving circuit for forming a first and a second operational amplifier circuits, amplifying said input voltage received by said first and said second differential receiving circuits, and generating said output voltage respectively.

* * * * *